(12) United States Patent
Arisumi et al.

(10) Patent No.: US 9,837,430 B2
(45) Date of Patent: Dec. 5, 2017

(54) SEMICONDUCTOR MEMORY DEVICE AND METHOD FOR MANUFACTURING SAME

(71) Applicant: Toshiba Memory Corporation, Minato-ku (JP)

(72) Inventors: Osamu Arisumi, Kuwana (JP); Toshihiko Iinuma, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/926,385

(22) Filed: Oct. 29, 2015

(65) Prior Publication Data
US 2017/0069646 A1 Mar. 9, 2017

Related U.S. Application Data

(60) Provisional application No. 62/216,194, filed on Sep. 9, 2015.

(51) Int. Cl.
H01L 27/11 (2006.01)
H01L 27/11582 (2017.01)
H01L 27/1157 (2017.01)

(52) U.S. Cl.
CPC .... H01L 27/11582 (2013.01); H01L 27/1157 (2013.01)

(58) Field of Classification Search
CPC .................................. H01L 27/11568
See application file for complete search history.

(56) References Cited

U.S. PATENT DOCUMENTS

| 8,017,993 | B2 | 9/2011 | Kidoh et al. |
| 8,815,676 | B2 | 8/2014 | Yang et al. |
| 8,969,948 | B2 | 3/2015 | Simsek-Ege et al. |
| 2014/0061577 | A1 | 3/2014 | Kanno et al. |

Primary Examiner — Fernando L. Toledo
Assistant Examiner — Valerie N Newton
(74) Attorney, Agent, or Firm — Oblon, McClelland, Maier & Neustadt, L.L.P.

(57) ABSTRACT

According to one embodiment, a semiconductor memory device includes a substrate; a stacked body provided on the substrate, the stacked body including a plurality of electrode layers, a plurality of insulating layers, the plurality of insulating layers having a side surface, a plurality of first conductive films provided between the plurality of electrode layers and the plurality of insulating layers, the plurality of first conductive films having a side surface, and a blocking insulating film, the blocking insulating film including a first portion and a second portion; and a semiconductor film. The first distance between the semiconductor film and the side surface of the plurality of first conductive films is shorter than a second distance between the semiconductor film and the second portion.

18 Claims, 10 Drawing Sheets

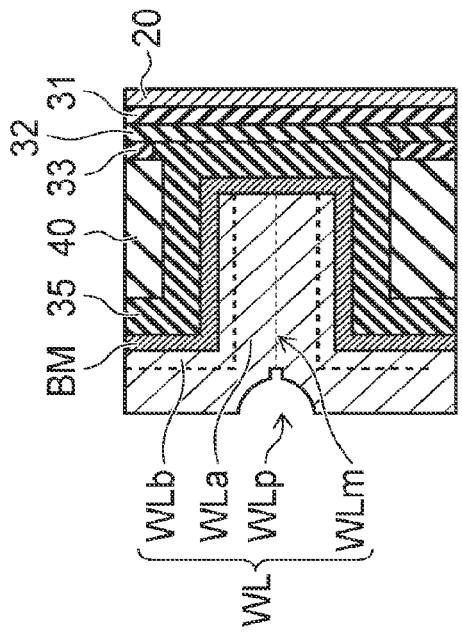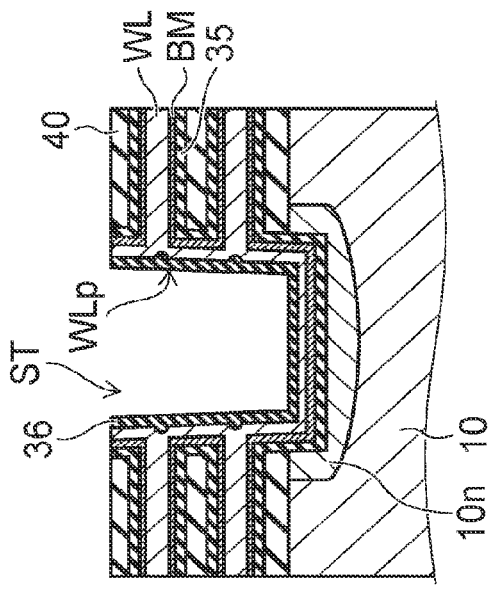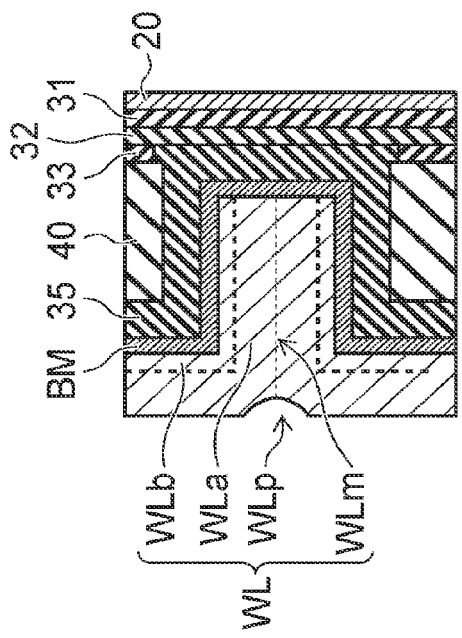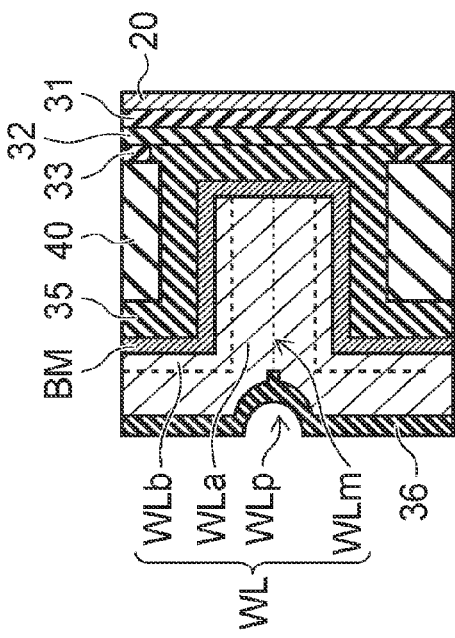

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/216,194 field on Sep. 9, 2015; the entire contents of which are incorporated herein by reference.

FIELD

Embodiments described herein relate generally to a semiconductor memory device and a method for manufacturing same.

BACKGROUND

A memory device having a three-dimensional structure including multiple memory cells stacked with insulating layers interposed has been proposed.

There may be a risk of degradation of the characteristics of the device recited above.

BRIEF DESCRIPTION OF THE DRAWINGS

FIG. 4 to FIG. 10C are schematic views showing a method for manufacturing the semiconductor memory device of the embodiment.

DETAILED DESCRIPTION

Figure 1:
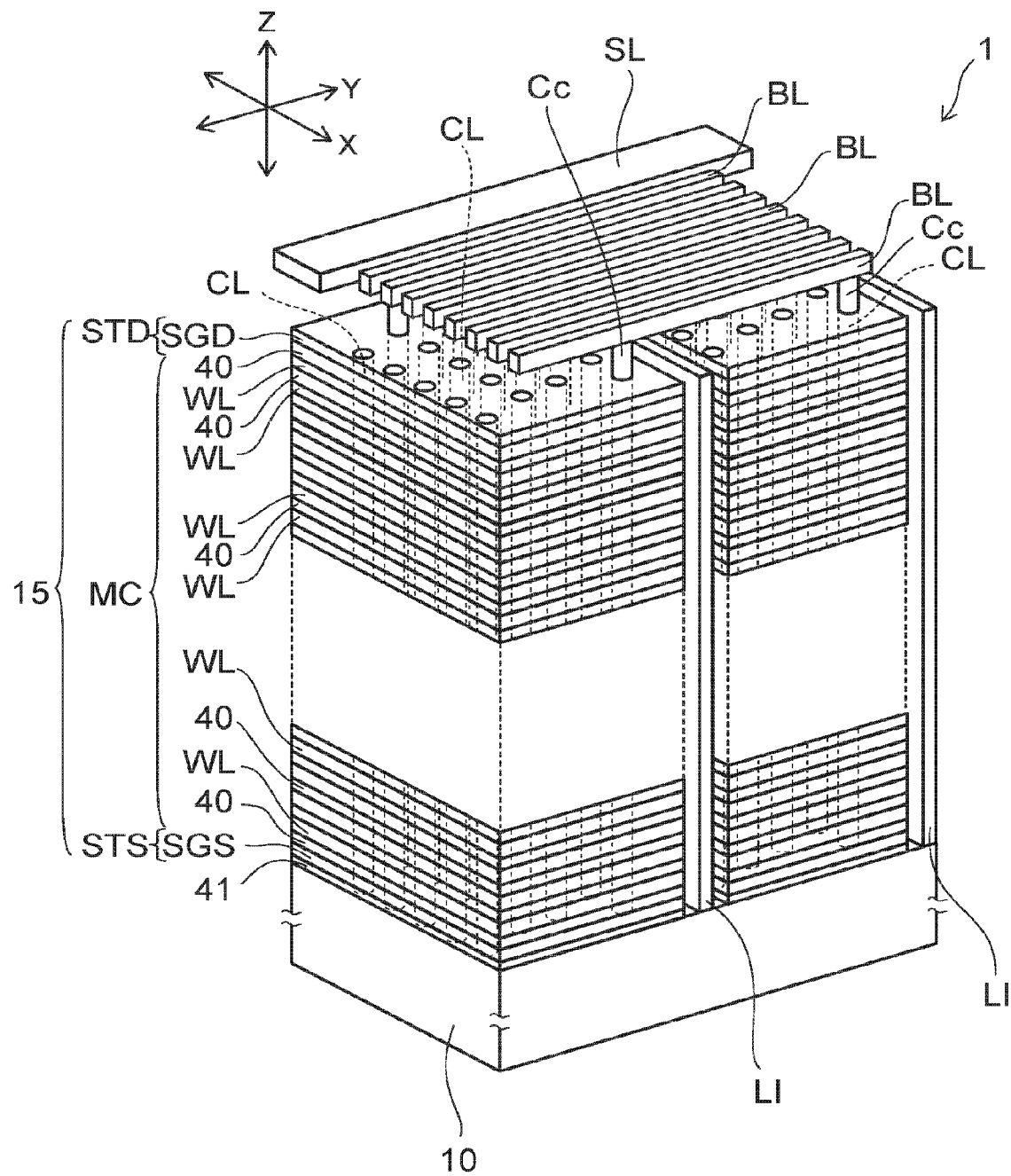
FIG. 1 is a schematic perspective view of a memory cell array of an embodiment.

According to one embodiment, a semiconductor memory device includes a substrate; a stacked body provided on the substrate, the stacked body including a plurality of electrode layers stacked to be separated from each other, a plurality of insulating layers provided between the plurality of electrode layers, the plurality of insulating layers having a side surface, a plurality of first conductive films provided between the plurality of electrode layers and the plurality of insulating layers, the plurality of first conductive films having a side surface, and a blocking insulating film including a first portion and a second portion, the first portion provided between the plurality of insulating layers and the plurality of first conductive films, the second portion contacting the side surface of the plurality of insulating layers; and a semiconductor film provided inside the stacked body, the semiconductor film extending in a stacking direction of the stacked body. The first distance between the semiconductor film and the side surface of the plurality of first conductive films is shorter than the second distance between the semiconductor film and the second portion.

Embodiments will now be described with reference to the drawings. The same components in the drawings are marked with the same reference numerals.

An example of the configuration of a memory cell array 1 of the embodiment will now be described with reference to FIG. 1, FIG. 2A, and FIG. 2B.

FIG. 1 is a schematic perspective view of the memory cell array 1 of the embodiment. In FIG. 1, the insulating layers on the stacked body, etc., are not shown for easier viewing of the drawing.

Figure 2A:
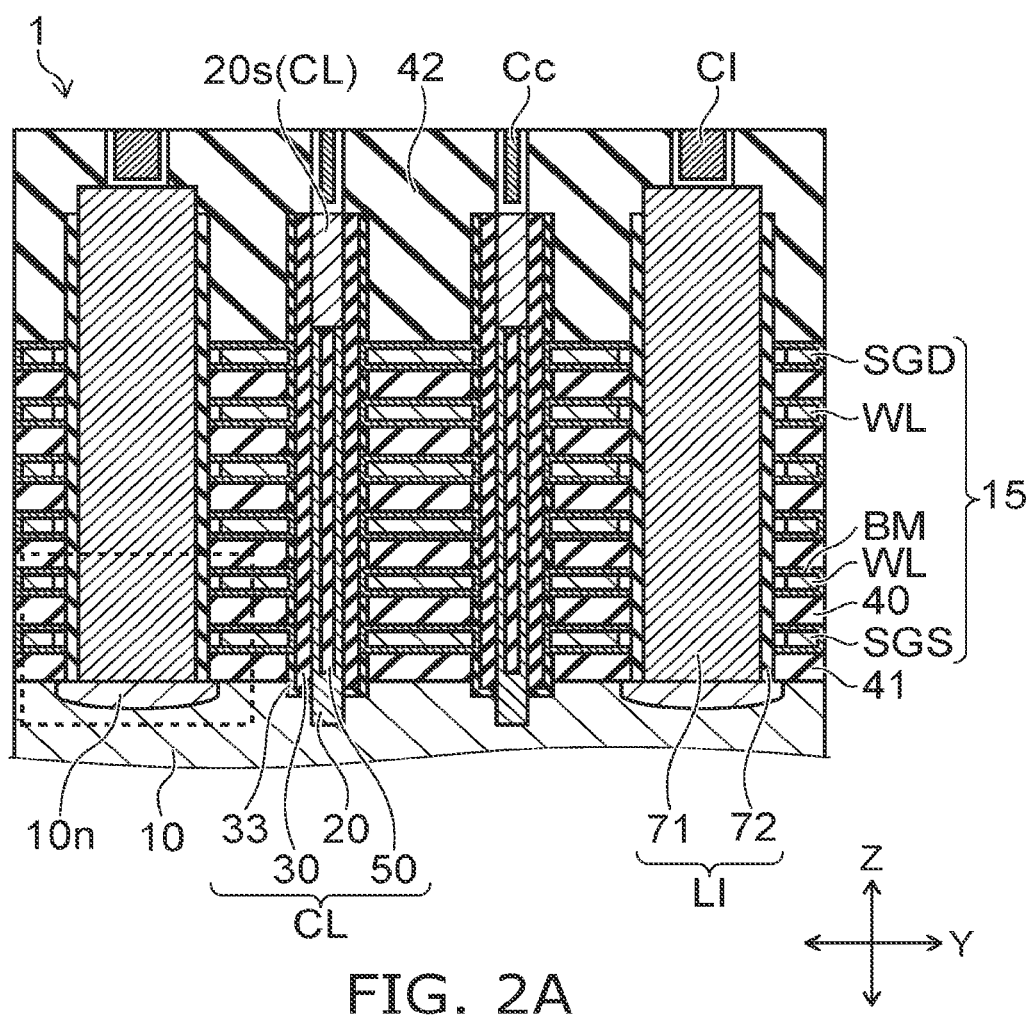
FIG. 2A is a schematic cross-sectional view of the memory cell array of the embodiment.
Figure 2B:
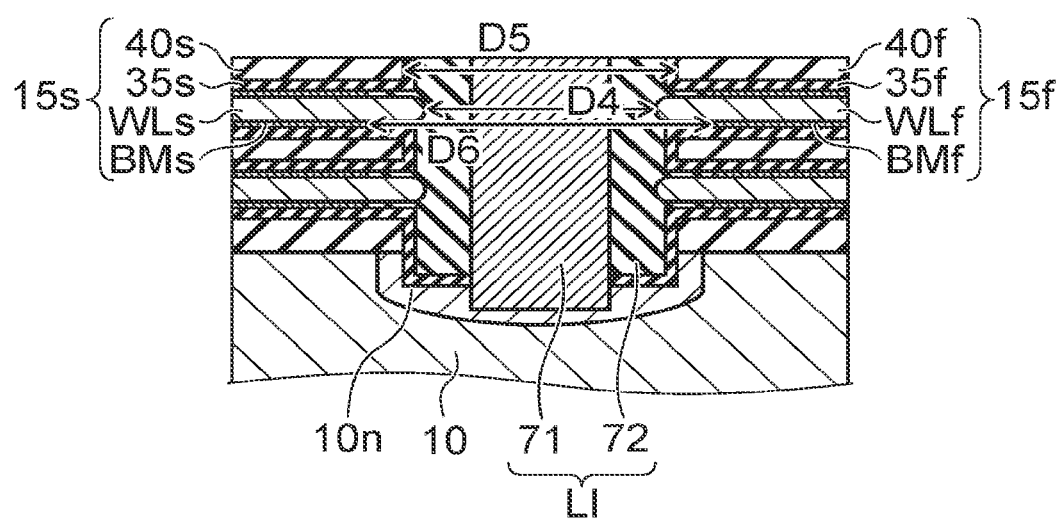
FIG. 2B is an enlarged schematic cross-sectional view of the memory cell array of the embodiment.

FIG. 2A is a schematic cross-sectional view of a memory cell array of the embodiment; and FIG. 2B is an enlarged schematic cross-sectional view of the dotted line portion of FIG. 2A. For easier viewing of the drawing in FIG. 2A as well, the insulating layers on the stacked body, etc., are not shown; and the contacts with the substrate are simplified.

In FIG. 1, two mutually-orthogonal directions are taken as an X-direction (a first direction) and a Y-direction (a second direction); and a direction orthogonal to the X-direction and the Y-direction (the XY plane) in which multiple layers of electrode layers WL are stacked is taken as a Z-direction (a stacking direction).

As shown in FIG. 1 and FIG. 2A, the memory cell array 1 includes a substrate 10, a stacked body 15, multiple columnar units CL, an interconnect layer LI, and upper layer interconnects. Bit lines BL and a source layer SL are shown as the upper layer interconnects in FIG. 1.

The stacked body 15 is provided on the substrate 10 with an insulating layer 41 interposed. The stacked body 15 includes a source-side selection gate SGS, a drain-side selection gate SGD, the multiple electrode layers WL, and multiple insulating layers 40.

The source-side selection gate SGS is provided in the lowermost layer of the stacked body 15. The drain-side selection gate SGD is provided in the uppermost layer of the stacked body 15.

The multiple electrode layers WL are stacked to be separated from each other. The multiple insulating layers 40 are provided between the multiple electrode layers WL.

Barrier films BM (first conductive films) are provided on portions of the wall surfaces (the upper surfaces, the lower surfaces, and the side surfaces) of the electrode layers WL. The multiple barrier films BM are provided between the multiple electrode layers WL and the multiple insulating layers 40. The number of layers of electrode layers WL shown in the drawings is an example; and the number of layers of electrode layers WL is arbitrary.

The electrode layers WL include a metal. For example, the electrode layers WL include at least one of tungsten or molybdenum and may include silicon or a metal silicide. The source-side selection gate SGS and the drain-side selection gate SGD include the same material as the electrode layers WL. The insulating layers 40 include, for example, silicon oxide films. For example, the barrier films BM include titanium and include stacked films of titanium and titanium nitride.

For example, the thickness of the drain-side selection gate SGD and the thickness of the source-side selection gate SGS are thicker than the thickness of one layer of the electrode layers WL; and multiple layers of the drain-side selection gate SGD and the source-side selection gate SGS may be provided. The thickness of the drain-side selection gate SGD and the thickness of the source-side selection gate SGS may be the same as or thinner than the thickness of one layer of the electrode layers WL; and in such a case, similarly to the description recited above, multiple layers of the drain-side selection gate SGD and the source-side selection gate SGS may be provided. Here, the "thickness" is the thickness in the stacking direction of the stacked body 15 (the Z-direction).

The multiple columnar units CL that extend in the Z-direction are provided inside the stacked body 15. For example, the columnar units CL are provided in circular columnar or elliptical columnar configurations. For example, the multiple columnar units CL are provided in a staggered lattice configuration. Or, the multiple columnar units CL may be provided in a square lattice configuration along the X-direction and the Y-direction. The columnar units CL are electrically connected to the substrate 10.

The columnar unit CL includes a channel body 20, a memory film 30, a cover film 33, and a core insulating film 50. The memory film 30 is provided between the stacked body 15 and the channel body 20. The cover film 33 is provided between the memory film 30 and the multiple insulating layers 40. The memory film 30 and the channel body 20 extend in the Z-direction. The cover film 33 extends in the Z-direction and is provided, for example, discontinuously.

The core insulating film 50 is provided on the inner side of the channel body 20. For example, the channel body 20 may have a columnar configuration. In such a case, for example, the core insulating film 50 may not be provided on the inner side of the channel body 20.

The channel body 20 is, for example, a silicon film that has silicon as a major component. The cover film 33 and the core insulating film 50 include, for example, silicon oxide films and may include air gaps.

The interconnect layer LI that extends in the X-direction and the Z-direction through the stacked body 15 is provided in the stacked body 15. The interconnect layer LI includes a conductive layer 71 and an insulating film 72. The insulating film 72 is provided between the conductive layer 71 and the stacked body 15. The lower end of the interconnect layer LI is electrically connected to the channel body 20 (the semiconductor film) inside the columnar unit CL via the substrate 10.

The interconnect layer LI is electrically connected to a not-shown control circuit via the source layer SL above the interconnect layer LI.

The multiple bit lines BL are provided on the stacked body 15. The multiple bit lines BL are separated from each other in the X-direction and extend in the Y-direction.

The upper end of the channel body 20 is electrically connected to the bit line BL via a contact Cc. The lower end side of the channel body 20 contacts the substrate 10.

One of the multiple channel bodies 20 of the multiple columnar units CL selected from each region of the regions separated from each other in the Y-direction by the interconnect layer LI is electrically connected to one common bit line BL.

A drain-side selection transistor STD is provided at the upper end portion of the columnar unit CL; and a source-side selection transistor STS is provided at the lower end portion of the columnar unit CL.

Memory cells MC, the drain-side selection transistor STD, and the source-side selection transistor STS are vertical transistors in which current flows in the stacking direction of the stacked body 15.

The selection gates SGD and SGS function respectively as gate electrodes, i.e., selection gates of the selection transistors STD and STS. Insulating films that function respectively as gate insulator films of the selection transistors STD and STS are provided respectively between the channel bodies 20 and the selection gates SGD and STS.

The multiple memory cells MC that have the electrode layers WL as control gates of each layer are provided between the drain-side selection transistor STD and the source-side selection transistor STS. The multiple memory cells MC are stacked to be separated from each other.

The multiple memory cells MC, the drain-side selection transistor STD, and the source-side selection transistor STS are connected in series via the channel body 20 and are included in one memory string. The multiple memory cells MC are provided three-dimensionally in the X-direction, the Y-direction, and the Z-direction by arranging the memory strings in, for example, a staggered lattice configuration in a surface direction parallel to the X-Y plane.

The semiconductor memory device of the embodiment can freely and electrically erase/program data and retain the memory content even when the power supply is OFF.

As shown in FIG. 2B, the stacked body 15 includes, for example, a first stacked unit 15f and a second stacked unit 15s. In such a case, the interconnect layer LI is provided between the first stacked unit 15f and the second stacked unit 15s; and the first stacked unit 15f is separated from the second stacked unit 15s in the Y-direction.

The first stacked unit 15f includes multiple first electrode layers WLf, multiple first insulating layers 40f, multiple first barrier films BMf (first conductive units), and multiple first blocking insulating films 35f. The second stacked unit 15s includes multiple second electrode layers WLs, multiple second insulating layers 40s, multiple second barrier films BMs (second conductive units), and multiple second blocking insulating films 35s.

In the Y-direction, the multiple first electrode layers WLf are separated from the multiple second electrode layers WLs with the interconnect layer LI interposed. The multiple first electrode layers WLf are separated from the multiple second electrode layers WLs by a fourth distance D4.

In the Y-direction, the multiple first insulating layers 40f are separated from the multiple second insulating layers 40s with the interconnect layer LI interposed. The multiple first insulating layers 40f are separated from the multiple second insulating layers 40s by a fifth distance D5.

In the Y-direction, the multiple first barrier films BMf are separated from the multiple second barrier films BMs with the interconnect layer LI interposed. The multiple first barrier films BMf are separated from the multiple second barrier films BMs by a sixth distance D6.

The fourth distance D4 is shorter than the fifth distance D5 and the sixth distance D6. The fifth distance D5 is shorter than the sixth distance D6.

An example of the configuration of the memory cells MC of the embodiment and the periphery of the memory cells MC will now be described with reference to FIG. 3.

Figure 3:
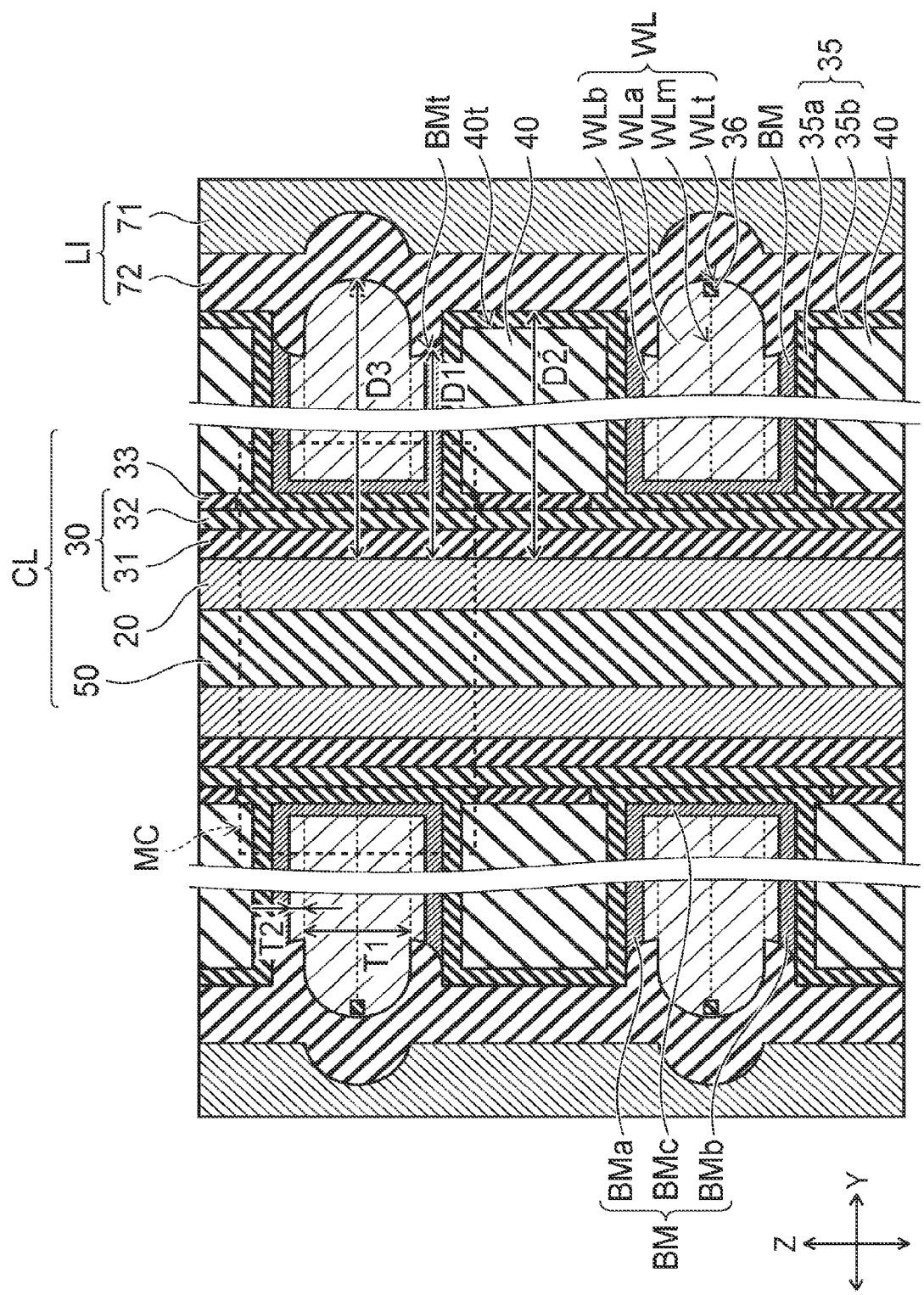
FIG. 3 is an enlarged schematic cross-sectional view of a portion of a columnar unit of the embodiment and a periphery of a portion of the columnar unit.

FIG. 3 is an enlarged schematic cross-sectional view of a portion of the columnar unit CL of the embodiment and the periphery of the portion of the columnar unit CL.

The memory cell MC is, for example, the charge trap type and includes the electrode layer WL, the memory film 30, the channel body 20, and a blocking insulating film 35.

The channel body 20 functions as a channel of the memory cell MC; and the electrode layer WL functions as a control gate of the memory cell MC. A charge storage film 32 functions as a data storage layer that stores charge injected from the channel body 20. In other words, the memory cells MC that have a structure in which a control gate is provided around the periphery of a channel are formed at the intersections between the channel body 20 and each of the electrode layers WL.

The memory film 30 includes, for example, the charge storage film 32 and a tunneling insulating film 31. The tunneling insulating film 31 contacts the channel body 20;

and the charge storage film 32 is provided between the tunneling insulating film 31 and the electrode layers WL.

The charge storage film 32 has many trap sites that trap the charge and includes, for example, at least one of a silicon nitride film or hafnium oxide.

The tunneling insulating film 31 is used as a potential barrier when the charge is injected from the channel body 20 into the charge storage film 32 or when the charge stored in the charge storage film 32 diffuses into the channel body 20. The tunneling insulating film 31 is, for example, a silicon oxide film.

Or, a stacked film (an ONO film) that has a structure in which a silicon nitride film is interposed between a pair of silicon oxide films may be used as the tunneling insulating film 31. In the case where the ONO film is used as the tunneling insulating film 31, compared to a single-layer of the silicon oxide film, the erasing operation is performed using a low electric field.

The blocking insulating film 35 is provided between the charge storage film 32 and the electrode layers WL and covers the wall surfaces of the electrode layers WL with the barrier films BM interposed between the blocking insulating film 35 and the electrode layers WL. In other words, the barrier films BM are provided between the blocking insulating film 35 and the electrode layers WL. The blocking insulating film 35 contacts the charge storage film 32. For example, the blocking insulating film 35 may be provided inside the columnar unit CL.

The blocking insulating film 35 includes a first portion 35a and a second portion 35b. The first portion 35a is provided as one body between the electrode layer WL and the insulating layer 40 and between the electrode layer WL and the charge storage film 32. The second portion 35b contacts the insulating film 72 and a side surface 40t of the insulating layer 40. The second portion 35b is provided as one body with the first portion 35a. In other words, the blocking insulating film 35 is provided as one body between the multiple electrode layers WL and between the multiple insulating layers 40.

The blocking insulating film 35 prevents the charge stored in the charge storage film 32 from diffusing into the electrode layer WL. The blocking insulating film 35 includes, for example, at least one of hafnium, aluminum, zirconium, or lanthanum; and a material that has a higher dielectric constant than a silicon nitride film (a high dielectric oxide film: a High-k film) is used.

The blocking insulating film 35 includes, for example, a first blocking film and a second blocking film. The second blocking film is disposed between the first blocking film and the charge storage film 32. The second blocking film is, for example, a silicon oxide film.

The first blocking film is provided in contact with the barrier film BM. The first blocking film is a film having a higher dielectric constant than the second blocking film and includes, for example, the at least one of hafnium, aluminum, zirconium, or lanthanum described above. For example, at least one of a silicon nitride film or aluminum oxide is used as the first blocking film.

By the first blocking film being provided in contact with the barrier film BM, back-tunneling electrons injected from the electrode layer WL in the erasing can be suppressed. In other words, the charge blocking property can be increased by using a stacked film of a silicon oxide film and of one of a silicon nitride film or a high dielectric oxide film as the blocking insulating film 35.

The multiple electrode layers WL include a bulk film WLa (a third conductive film) and a nucleation film WLb (a second conductive film). The nucleation film WLb contacts the barrier film BM. In the Z-direction, the bulk film WLa is provided with the nucleation films WLb interposed between the bulk film WLa and the barrier films BM. In the Z-direction, a thickness T1 of the bulk film WLa is thicker than a thickness T2 of the nucleation film WLb.

The bulk film WLa includes the same material as the nucleation film WLb and includes, for example, tungsten. For example, the nucleation film WLb includes at least one of boron or silicon; and the bulk film WLa does not include boron or silicon. Therefore, it is possible to confirm the difference between the bulk film WLa and the nucleation film WLb by analyzing the materials included in the bulk film WLa and the nucleation film WLb. Analysis methods of the materials include, for example, EDX (Energy Dispersive X-ray spectrometry), EELS (Electron Energy-Loss Spectroscopy), SIMS (Secondary Ion Mass Spectrometry), etc.

The bulk film WLa includes an end portion WLt. The end portion WLt is separated from the barrier film BM, the nucleation film WLb, and the blocking insulating film 35. The end portion WLt contacts the insulating film 72 and is covered with the insulating film 72.

The multiple barrier films BM have side surfaces BMt that contact the insulating film 72. In the Y-direction, the side surfaces BMt are provided on the columnar unit CL side of the second portion 35b of the blocking insulating film 35. In other words, a first distance D1 between the channel body 20 and the side surfaces BMt of the multiple barrier films BM is shorter than a second distance D2 between the channel body 20 and the surface of the second portion 35b contacting the interconnect layer LI.

In the Y-direction, the second portion 35b of the blocking insulating film 35 is provided on the columnar unit CL side of the end portion WLt of the bulk film WLa included in the multiple electrode layers WL. In other words, a third distance D3 between the end portion WLt and the channel body 20 is longer than the first distance D1 and the second distance D2.

In the Y-direction, the distance between the channel body 20 and the side surface of the nucleation film WLb is not more than the first distance D1. For example, the side surface of the nucleation film WLb may be in the same plane as the side surface BMt of the barrier film BM.

The cover film 33 is provided between the charge storage film 32 and the insulating layers 40. The cover film 33 contacts the charge storage film 32 and the side surfaces of the insulating layers 40. For example, the cover film 33 is provided to be discontinuous and to have the blocking insulating film 35 interposed in the Z-direction. In other words, the cover film 33 is provided on the upper surface and the lower surface of the blocking insulating film 35 and is separated from the side surface of the blocking insulating film 35.

The bulk film WLa includes, for example, a seam portion WLm. The seam portion WLm extends toward the direction of the columnar unit CL from the end portion WLt. For example, a capping film 36 is provided inside the seam portion WLm at the end portion WLt. The capping film 36 includes, for example, a material having a low etching rate for the etching of the electrode layers WL and includes at least one of titanium, tantalum, aluminum, ruthenium, platinum, iridium, gold, copper, nickel, cobalt, tungsten, or silicon. The capping film 36 includes, for example, titanium nitride.

A method for manufacturing the semiconductor memory device of the embodiment will now be described with reference to FIG. 4 to FIG. 10C.

A description is partially omitted for content similar to the configuration described above.

Figure 4:
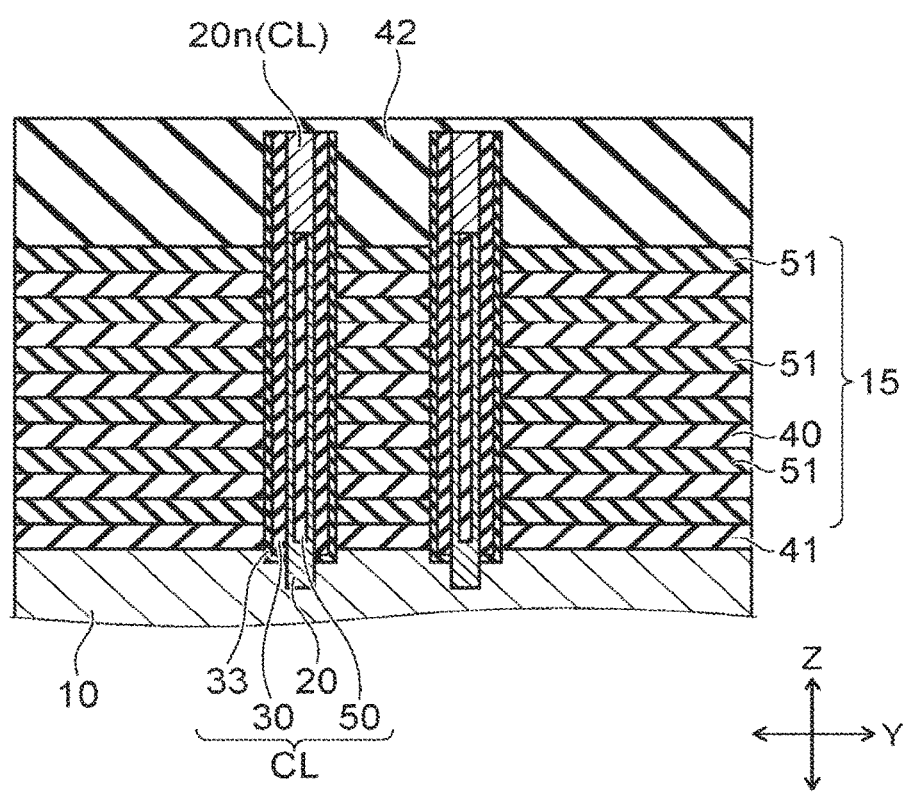

As shown in FIG. 4, the insulating layer 41 is formed on the substrate 10. The stacked body 15 is formed on the insulating layer 41.

The stacked body 15 includes multiple sacrificial layers 51 (multiple first layers) and the multiple insulating layers 40 (multiple second layers). The multiple sacrificial layers 51 are stacked to be separated from each other. The multiple insulating layers 40 are formed between the multiple sacrificial layers 51 and are stacked, for example, alternately with the multiple sacrificial layers 51. The multiple sacrificial layers 51 include, for example, silicon nitride films. The multiple first insulating layers 40 include, for example, silicon oxide films.

Then, the columnar units CL are formed inside the stacked body 15. As the method for forming the columnar units CL, for example, holes that pierce the stacked body 15 and reach the substrate 10 are made. Subsequently, the columnar units CL are formed by forming the cover film 33, the memory film 30, the channel body 20, and the core insulating film 50 in order inside the holes. At this time, the channel body 20 is electrically connected to the substrate 10.

The cover film 33 includes, for example, a silicon oxide film. The channel body 20 includes, for example, amorphous silicon. The core insulating film 50 includes, for example, a silicon oxide film. The charge storage film 32 of the memory film 30 includes, for example, a silicon nitride film; and the tunneling insulating film 31 includes, for example, a silicon oxide film. Subsequently, an insulating layer 42 is formed on the stacked body 15.

Figure 5:
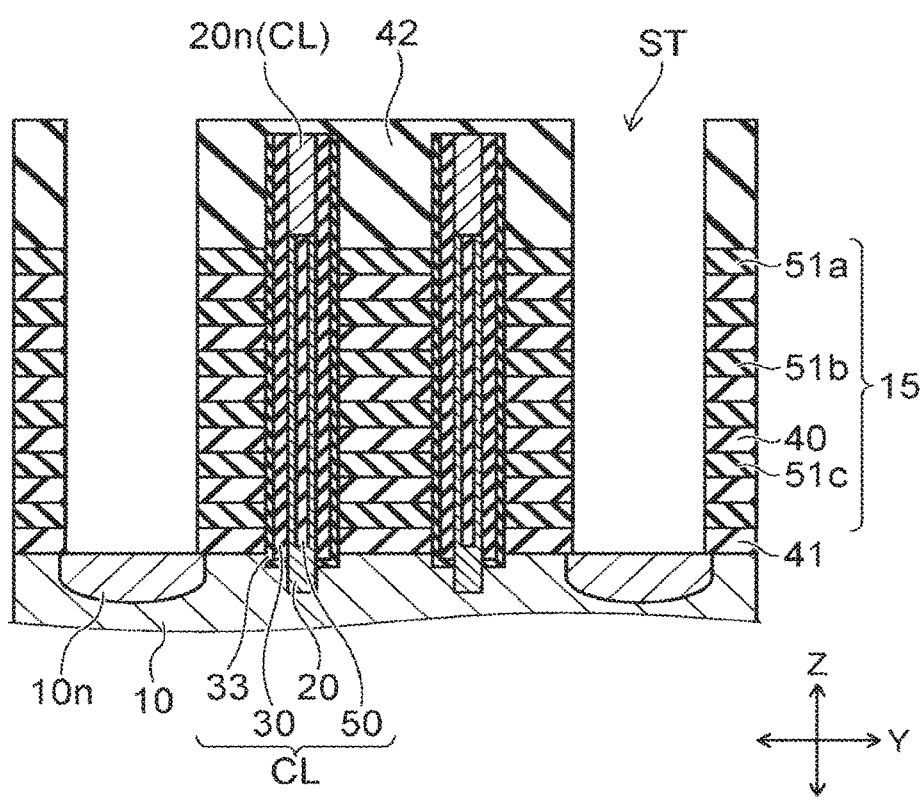

As shown in FIG. 5, slits ST are made in the insulating layer 42 and in the stacked body 15. The slits ST pierce the insulating layer 42 and the stacked body 15 and reach the substrate 10. The slits ST extend in the X-direction. Subsequently, semiconductor units 10n are formed by doping the portions of the substrate 10 exposed inside the slits ST with, for example, an n-type impurity (e.g., phosphorus). For example, the substrate 10 may be doped with a p-type impurity (e.g., boron).

Figure 6:
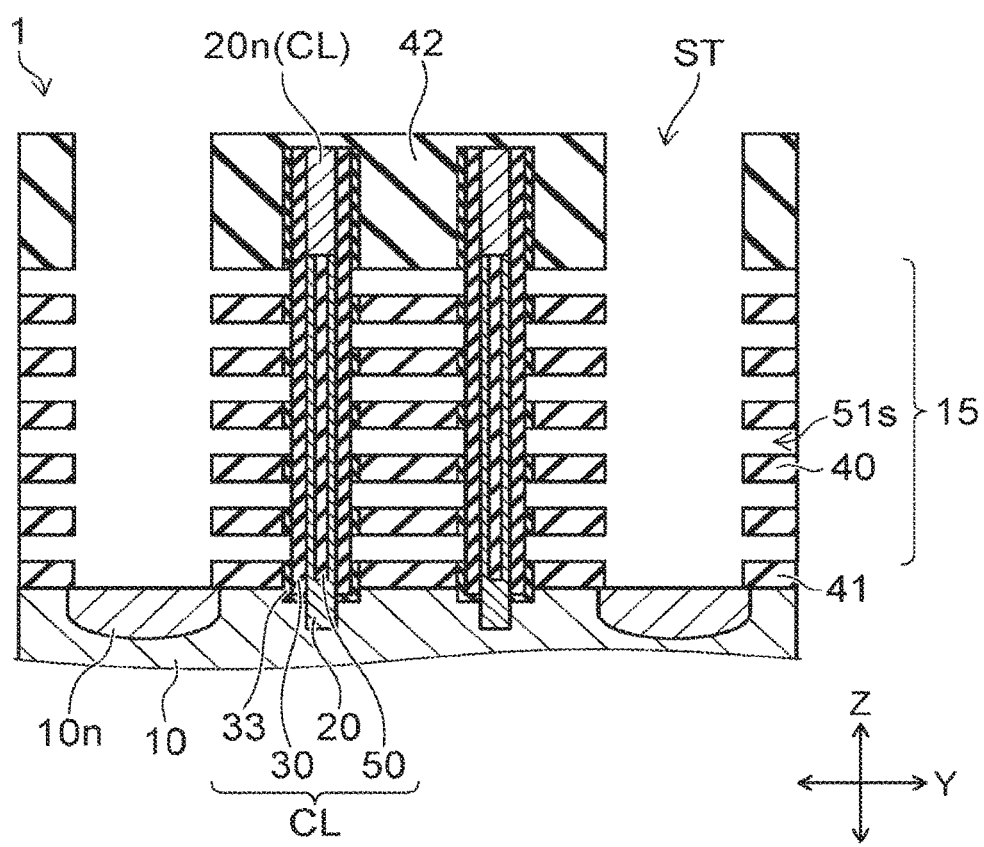

As shown in FIG. 6, the multiple sacrificial layers 51 are removed using, for example, an etching method via the slits ST. Thereby, spaces 51s are made in the portions where the multiple sacrificial layers 51 were formed. For example, phosphoric acid (Hot-$H_3PO_4$) is used in the etching method.

Then, a portion of the cover film 33 is removed. The cover film 33 may not be removed. In such a case, the processes proceed in the state in which the cover film 33 is formed as one body in the Z-direction.

Figure 7:
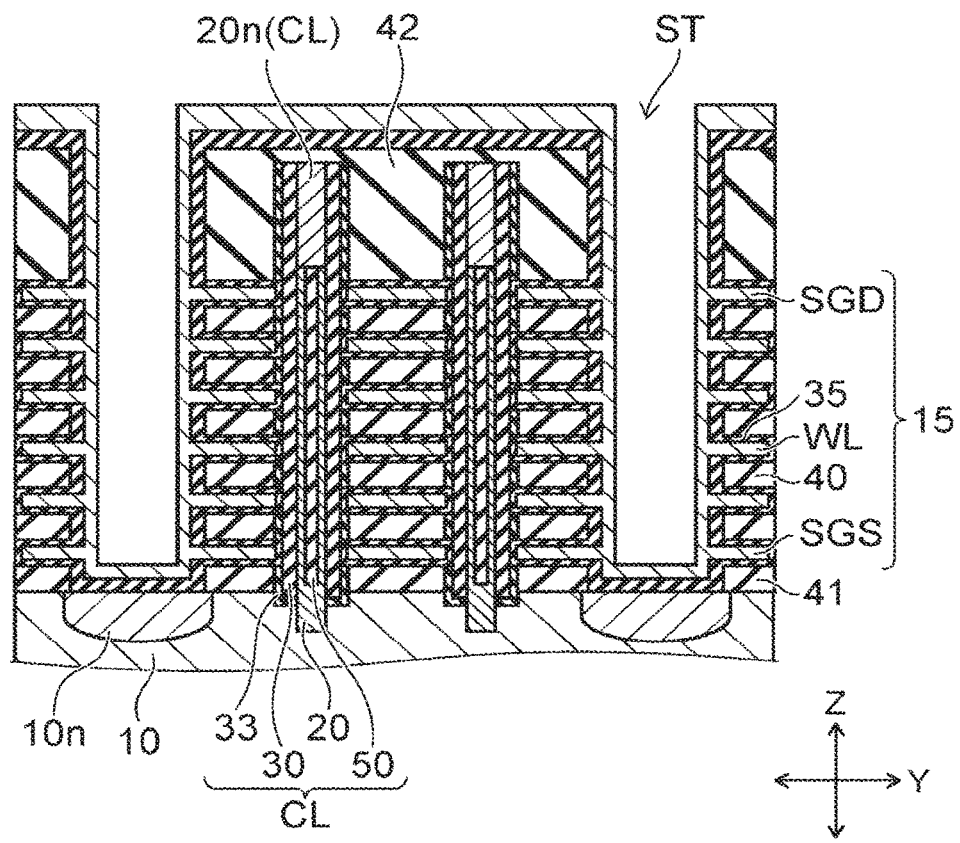

As shown in FIG. 7 and FIG. 8A, the blocking insulating film 35 is formed on the inner walls of the spaces 51s. The barrier film BM is formed on the inner side of the blocking insulating film 35; and the electrode layer WL is formed on the inner side of the barrier film BM. The blocking insulating film 35, the barrier film BM, and the electrode layer WL also are formed on the side surfaces of the slits ST. In other words, the blocking insulating film 35, the barrier film BM, and the electrode layer WL are formed on the side surfaces of the multiple insulating layers 40. For example, the electrode layer WL of the lowermost layer of the stacked body 15 is formed as the source-side selection gate SGS; and, for example, the electrode layer WL of the uppermost layer is formed as the drain-side selection gate SGD.

The blocking insulating film 35 includes, for example, a stacked film of a silicon oxide film and aluminum oxide. The barrier film BM includes, for example, a stacked film of titanium nitride and titanium. For example, the electrode layer WL, the source-side selection gate SGS, and the drain-side selection gate SGD include, for example, tungsten.

As shown in FIG. 8A, the electrode layer WL includes the nucleation film WLb and the bulk film WLa. The nucleation film WLb is formed on the inner side of the barrier film BM. The bulk film WLa is formed on the inner side of the nucleation film WLb. In the Z-direction, the thickness of the bulk film WLa is thicker than the thickness of the nucleation film WLb.

For example, the nucleation film WLb and the bulk film WLa are formed by CVD (Chemical Vapor Deposition) using a tungsten hexafluoride gas. For example, the nucleation film WLb is formed using at least one of diborane or silane. For example, the bulk film WLa is formed using hydrogen gas.

For example, the seam portion WLm is formed on the inner side of the bulk film WLa. For example, the seam portion WLm is formed when forming the bulk film WLa.

A space WLp is made in the side surface of the bulk film WLa formed on the slit ST side. The space WLp is made in the tip of the seam portion WLm. The space WLp is made on the slit ST center side of the side surface of the blocking insulating film 35.

As shown in FIG. 8B, the space WLp is caused to enlarge in the direction of the columnar unit CL along the seam portion WLm by, for example, down-flow etching. Thereby, the space WLp is made to be deep in the bulk film WLa direction. This process may be omitted.

As shown in FIG. 8C and FIG. 8D, the capping film 36 is formed via the slit ST. The capping film 36 is formed on the side surface and bottom surface of the slit ST. Thereby, the capping film 36 is formed on the side surface of the bulk film WLa and inside the space WLp. For example, titanium nitride is used as the capping film 36.

Figure 9A:
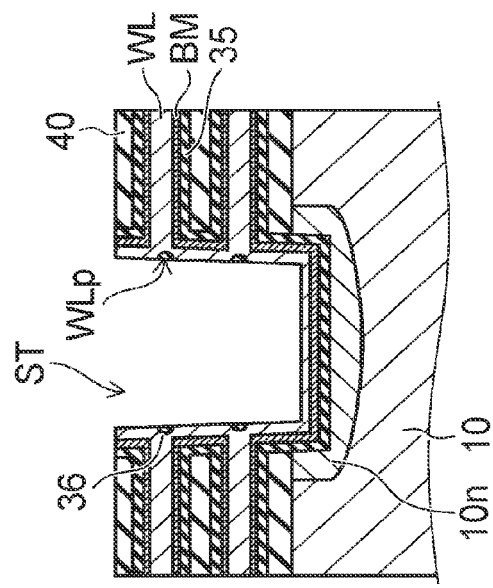
Figure 9B:
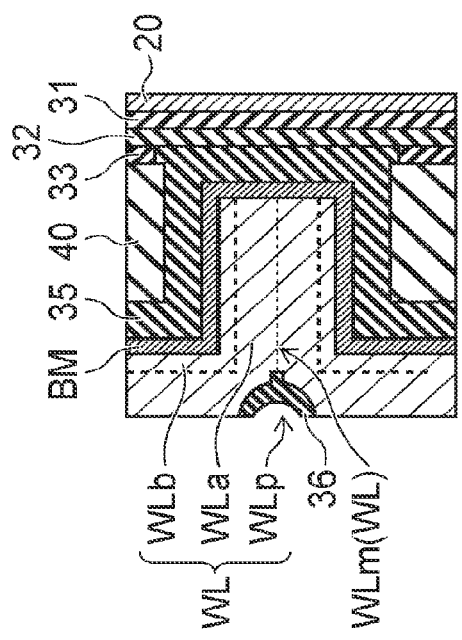

As shown in FIG. 9A and FIG. 9B, the capping film 36 that is formed on the side surface and bottom surface of the slit ST is removed. For example, RIE (Reactive Ion Etching) is used as the method for removing the capping film 36. Thereby, the capping film 36 that is formed on the side surface of the bulk film WLa is removed; and the capping film 36 that is formed inside the space WLp remains without being removed.

Figure 9C:
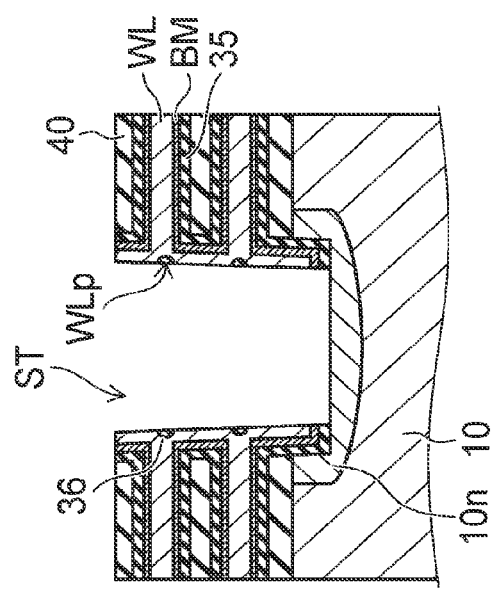

As shown in FIG. 9C, the electrode layer WL (the bulk film WLa and the nucleation film WLb), the barrier film BM, and the blocking insulating film 35 that are formed on the bottom surface of the slit ST are removed. Thereby, the semiconductor unit 10n of the substrate 10 is exposed at the bottom surface of the slit ST.

Figure 10A:
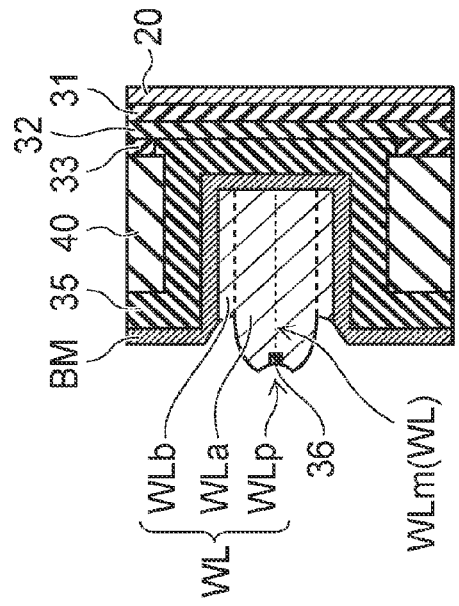
Figure 10B:
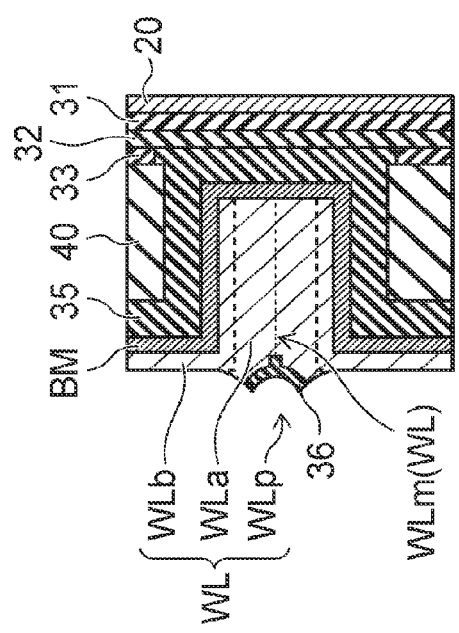
Figure 10C:
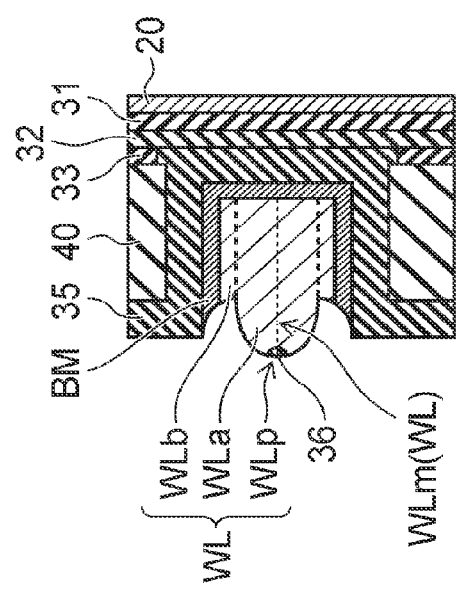

As shown in FIG. 10A to FIG. 10C, the bulk film WLa, the nucleation film WLb, the capping film 36, and the barrier film BM are removed. For example, down-flow etching via the slit ST is used as the method for removing the films WLa, WLb, 36, and BM. At this time, the etching rate is highest for the nucleation film WLb, next highest for the bulk film WLa, and lowest for the capping film 36; and the etching rate for the barrier film BM is equal to or lower than the etching rate for the bulk film WLa.

Therefore, in the initial etching stage as shown in FIG. 10A, more of the bulk film WLa is removed than the capping film 36. Thereby, the side surface of the bulk film WLa is removed; and the side surface of the nucleation film WLb is exposed in the slit ST. At this time, the capping film 36 remains without being removed completely. A portion of the bulk film WLa and the capping film 36 is formed on the slit ST center side of the side surface of the blocking insulating film 35.

Subsequently, as shown in FIG. 10B, much of the nucleation film WLb is removed. Thereby, the side surface of the nucleation film WLb is removed; and the side surface of the barrier film BM is exposed in the slit ST. Also, for example, the nucleation film WLb recedes to the columnar unit CL side of the side surface of the barrier film BM and may recede to the columnar unit CL side of the side surface of the blocking insulating film 35. At this time, the capping film 36 remains without being removed completely.

Subsequently, as shown in FIG. 10C, the side surface of the barrier film BM is removed; and the side surface of the blocking insulating film 35 is exposed in the slit ST. At this time, for example, the capping film 36 remains without being removed completely. Therefore, the side surface of the blocking insulating film 35 is formed to be on the columnar unit CL side of the capping film 36 and the end portion WLt of the bulk film WLa.

Subsequently, as shown in FIG. 2A, the insulating film 72 is formed on the slit ST side surface; and the conductive layer is formed on the inner side of the insulating film 72. Thereby, the interconnect layer LI is formed. Then, contacts CI and Cc are formed respectively on the interconnect layer LI and the columnar unit CL; the upper layer interconnects shown in FIG. 1, etc., are formed; and the semiconductor memory device of the embodiment is formed.

Effects of the embodiment will now be described.

According to the embodiment, the first distance D1 between the channel body 20 and the side surface BMt of the barrier film BM is shorter than the second distance D2 between the channel body 20 and the second portion 35b of the blocking insulating film 35. Also, the third distance D3 between the channel body 20 and the end portion WLt of the electrode layer WL is longer than the first distance D1 and the second distance D2. Thereby, it is possible to suppress degradation of the characteristics of the device.

For example, there may be a case where the first distance D1 is longer than the second distance D2. In such a case, the side surface BMt of the barrier film BM is provided on the interconnect layer LI side of the second portion 35b of the blocking insulating film 35. Therefore, there may be a possibility that shorts between the electrode layers WL stacked above and below or an increase of the leakage current may occur.

Also, for example, there may be a case where the third distance D3 is shorter than the first distance D1 and the second distance D2. In such a case, the end portion WLt of the electrode layer WL is provided on the columnar unit CL side of the side surface BMt of the barrier film BM and the second portion 35b of the blocking insulating film 35. Therefore, the volume of the electrode layer WL provided between the interconnect layer LI and the columnar unit CL becomes small; and the resistance of the electrode layer WL may increase drastically. Therefore, the possibility that degradation of the device characteristics such as a decrease of the programming speed may occur becomes high.

Further, for example, in the case where the thickness of the electrode layer WL is set to be thick to reduce the resistance of the electrode layer WL described above, the size of the entire device increases drastically. Therefore, for example, the difficulty of processes such as patterning trenches to form the columnar units CL, etc., increases; and the possibility that the desired etching patterning configuration is not obtained becomes high.

Conversely, according to the embodiment, the side surface BMt of the barrier film BM is provided on the columnar unit CL side of the second portion 35b of the blocking insulating film 35. Therefore, the possibility that the shorts between the electrode layers WL stacked above and below or the increase of the leakage current may occur can be suppressed.

Further, the end portion WLt of the electrode layer WL is provided on the interconnect layer LI side of the side surface BMt of the barrier film BM and the second portion 35b of the blocking insulating film 35. Therefore, the volume of the electrode layers WL provided between the interconnect layer LI and the columnar unit CL can be increased; and the resistance of the electrode layers WL can be reduced drastically. Further, because it is unnecessary to set the thickness of the electrode layer WL to be thick, the enlargement of the size of the entire device can be suppressed.

Also, according to the embodiment, the stacked body 15 includes the first stacked unit 15f and the second stacked unit 15s provided with the interconnect layer LI interposed between the first stacked unit 15f and the second stacked unit 15s. In the Y-direction, the fourth distance D4 between the first electrode layers WLf and the second electrode layers WLs is shorter than the fifth distance D5 between the first insulating layers 40f and the second insulating layers 40s. The fifth distance D5 is shorter than the sixth distance D6 between the first barrier films BMf and the second barrier films BMs. Therefore, similarly to the configuration described above, the possibility that the shorts between the electrode layers WL stacked above and below and the increase of the leakage current may occur is suppressed; and the volume of the electrode layers WL can be increased. In other words, according to the embodiment, it is possible to suppress the degradation of the device characteristics.

In addition to the description recited above, according to the embodiment, the capping film 36 is provided inside the end portion WLt of the electrode layer WL. Thereby, it is possible to suppress the degradation of the characteristics of the device.

For example, in the case where the seam portion WLm is provided in the electrode layer WL, there is a possibility that permeating etching via the seam portion WLm, etc., may occur and the interior of the electrode layer WL may be eroded. Thereby, the volume of the electrode layers WL becomes small; and the resistance of the electrode layers WL may increase drastically. Therefore, the possibility that the degradation of the device characteristics may occur becomes high.

Conversely, according to the embodiment, the capping film 36 is provided inside the seam portion WLm at the end portion WLt. Thereby, the capping film 36 functions as the capping film of the seam portion WLm. Therefore, the permeating etching via the seam portion WLm, etc., can be suppressed; and the degradation of the electrode layers WL can be prevented. Therefore, according to the embodiment, it is possible to suppress the degradation of the device characteristics.

Further, according to the embodiment, the multiple electrode layers WL include the bulk film WLa and the nucleation film WLb. For example, down-flow etching is used in the process of forming the electrode layers WL described above. The etching rate of the conditions used at this time is highest for the nucleation film WLb, next highest for the bulk film WLa, and lowest for the capping film 36; and the etching rate for the barrier film BM is equal to or lower than the etching rate for the bulk film WLa. Thereby, it is possible to easily form the electrode layers WL having the configuration described above.

Also, in the Z-direction, the thickness of the bulk film WLa is thicker than the thickness of the nucleation film WLb. Thereby, it can be easy to easily form the electrode layers WL having the configuration described above. Therefore, according to the embodiment, it is possible to suppress the degradation of the device characteristics.

Although the columnar unit CL has a configuration in which the columnar unit CL is electrically connected to the interconnect layer LI via the substrate 10 in the embodiment described above, the columnar unit CL may have a configuration in which the electrical connection to the interconnect layer LI is not via the substrate 10.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:
   a plurality of electrode layers stacked in a first direction and extending in a second direction crossing the first direction, the plurality of electrode layers including a first electrode layer and a second electrode layer adjacent to the first electrode layer in the first direction,
   a semiconductor film extending in the first direction and along the plurality of electrode layers,
   a first insulating layer provided between the first electrode layer and the second electrode layer, and
   a first conductive film provided between the first electrode layer and the first insulating layer,
   the first conductive film having a first distal end and a first proximal end to the semiconductor film in the second direction,
   the first insulating layer having a second distal end and a second proximal end to the semiconductor layer in the second direction, and
   a first distance from the semiconductor film to the first distal end being shorter than a second distance from the semiconductor film to the second distal end.

2. The semiconductor memory device according to claim 1, wherein
   the first electrode layer includes a first portion and a second portion, the first portion having a third distal end and a third proximal end in the second direction, the second portion being provided between the first portion and the first conductive film, the second portion having a fourth distal end and a fourth proximal end to the semiconductor film in the second direction, and
   a third distance from the semiconductor film to the third distal end is longer than a fourth distance from the semiconductor film to the fourth distal end.

3. The semiconductor memory device according to claim 2, wherein the third distance is longer than the first distance.

4. The semiconductor memory device according to claim 2, wherein the third distance is longer than the second distance.

5. The semiconductor memory device according to claim 2, wherein
   the fourth distance is not more than the first distance.

6. The semiconductor memory device according to claim 2, further comprising:
   a capping film provided on the third distal end.

7. The semiconductor memory device according to claim 6, wherein the capping film includes at least one of titanium, tantalum, aluminum, ruthenium, platinum, iridium, gold, copper, nickel, cobalt, tungsten, or silicon.

8. The semiconductor memory device according to claim 2, further comprising:
   an interconnect layer provided along the plurality of electrode layers, the interconnect layer extending in the first direction and in a third direction crossing the first direction and the second direction,
   wherein the interconnect layer faces the first distal end, the second distal end, the third distal end and the fourth distal end with an insulator interposed.

9. The semiconductor memory device according to claim 8, further comprising:
   a plurality of other electrode layers stacked in the first direction and including a third electrode layer and a fourth electrode layer adjacent to the third electrode layer in the first direction, the interconnect layer being disposed between the plurality of electrode layers and the plurality of other electrode layers, the third electrode layer being positioned in the first direction at a level same as the first electrode layer, and the fourth electrode layer being positioned in the first direction at a level same as the second electrode layer; and
   a second insulating layer provided between the third electrode layer and the fourth electrode layer,
   wherein a fifth distance from the first electrode layer to the third electrode layer is shorter than a sixth distance from the first insulating layer to the second insulating layer.

10. The semiconductor memory device according to claim 9, further comprising:
    a second conductive film provided between the third electrode layer and the second insulating layer,
    wherein a seventh distance from the first conductive film to the second conductive film is longer than the sixth distance.

11. A semiconductor memory device, comprising:
    a first stacked unit including
      a plurality of electrode layers stacked in a first direction and including a first electrode layer and a second electrode layer adjacent to the first electrode layer, and
      a first insulating layer provided between the first electrode layer and the second electrode layer;
    a second stacked unit arranged with the first stacked unit in a second direction crossing the first direction, the second stacked unit including
      a plurality of other electrode layers stacked in the first direction and including a third electrode layer positioned in the first direction at a level same as the first electrode layer and a fourth electrode layer adjacent to the third electrode layer in the first direction, the fourth electrode layer being positioned in the first direction at a level same as the second electrode layer, and
      a second insulating layer provided between the third electrode layer and the fourth electrode layer,
    wherein a fifth distance in the second direction from the first electrode layer to the third electrode layer is shorter than a sixth distance in the second direction from the first insulating layer to the second insulating layer.

12. The semiconductor memory device according to claim 11, wherein
    the first stacked unit includes a first conductive film provided between the first electrode layer and the first insulating layer, the second stacked unit includes a second conductive film provided between the third electrode layer and the second insulating layer, and a seventh distance in the second direction from the first conductive film to the second conductive film is longer than the sixth distance.

13. The semiconductor memory device according to claim 12, wherein the first staked unit further includes a semiconductor film extending in the first direction and along the plurality of electrode layers, the first electrode layer has a third end proximal to the second stacked unit in the second direction, the first insulating layer has a second end proximal to the second stacked unit in the second direction, a third distance in the second direction from the semiconductor film to the third end is longer than a second distance in the second direction from the semiconductor film to the second end.

14. The semiconductor memory device according to claim 13, wherein the first conductive film has a first end proximal to the second stacked unit in the second direction, and a first distance in the second direction from the semiconductor film to the first end is shorter than the second distance.

15. The semiconductor memory device according to claim 13, wherein the first electrode layer includes a first portion and a second portion, the first portion having the third end in the second direction and the second portion being provided between the first portion and the first conductive film, the second portion having a fourth end proximal to the second stacked unit in the second direction, and a third distance in the second direction from the semiconductor film to the third end is longer than a fourth distance from the semiconductor film to the fourth end.

16. The semiconductor memory device according to claim 13, wherein the first stacked unit further includes a blocking insulating film including a first portion and a second portion, the first portion being provided between the first insulating layer and the first conductive film, and the second portion being provided on the second end.

17. The semiconductor memory device according to claim 13, further comprising:

a capping film provided on the third end.

18. The semiconductor memory device according to claim 17, wherein the capping film includes at least one of titanium, tantalum, aluminum, ruthenium, platinum, iridium, gold, copper, nickel, cobalt, tungsten, or silicon.

* * * * *